US009356567B2

(12) United States Patent
Mortensen et al.

(10) Patent No.: US 9,356,567 B2
(45) Date of Patent: May 31, 2016

(54) INTEGRATED AUDIO AMPLIFICATION CIRCUIT WITH MULTI-FUNCTIONAL EXTERNAL TERMINALS

(71) Applicant: Invensense, Inc., San Jose, CA (US)

(72) Inventors: Mikael Mortensen, Kgs. Lyngby (DK); Jacob Midtgaard, Fredensborg (DK)

(73) Assignee: INVENSENSE, INC., San Jose, CA (US)

( * ) Notice: Subject to any disclaimer, the term of this patent is extended or adjusted under 35 U.S.C. 154(b) by 418 days.

(21) Appl. No.: 13/789,838

(22) Filed: Mar. 8, 2013

(65) Prior Publication Data

US 2014/0254837 A1 Sep. 11, 2014

(51) Int. Cl.
*H03F 3/187* (2006.01)
*H03G 3/00* (2006.01)

(52) U.S. Cl.
CPC ............. *H03F 3/187* (2013.01); *H03G 3/002* (2013.01); *H03F 2200/03* (2013.01)

(58) Field of Classification Search
CPC ..... H03F 3/187; H03F 2200/03; H03G 3/002; H03G 9/005

USPC ....................... 381/77, 79; 709/208, 236, 237
See application file for complete search history.

(56) References Cited

U.S. PATENT DOCUMENTS

2009/0003629 A1  1/2009  Shajaan et al.

*Primary Examiner* — Antim Shah
(74) *Attorney, Agent, or Firm* — Maryam Imam; IPxLaw Group LLP

(57) ABSTRACT

An audio amplification circuit may include an input terminal for receipt of an input signal from a transducer. A signal processor may be coupled to the input terminal for receipt and processing of the input signal to generate a processed digital audio signal in accordance with a programmable configuration setting of the signal processor. A serial data transmission interface is configured for receipt of the processed digital audio signal and supply of a corresponding digital audio stream at an output terminal of the integrated audio amplification circuit. A serial data receipt interface may be coupled to an externally accessible configuration terminal of the integrated audio amplification circuit and a controller is configured to adjust one of the programmable configuration setting of the signal processor and a format of a digital audio stream in accordance with first configuration data received through the serial data receipt interface.

14 Claims, 6 Drawing Sheets

INTEGRATED AUDIO AMPLIFICATION CIRCUIT WITH MULTI-FUNCTIONAL EXTERNAL TERMINALS

The present invention relates in one aspect to an audio amplification circuit comprising an input terminal for receipt of an input signal from a transducer. A signal processor is operatively coupled to the input terminal for receipt and processing of the input signal to generate a processed digital audio signal in accordance with a programmable configuration setting of the signal processor. A serial data transmission interface is configured for receipt of the processed digital audio signal and supply of a corresponding digital audio stream at an output terminal of the integrated audio amplification circuit. A serial data receipt interface is operatively coupled to an externally accessible configuration terminal of the integrated audio amplification circuit and a controller is configured to adjust one of the programmable configuration setting of the signal processor and a format of a digital audio stream in accordance with first configuration data received through the serial data receipt interface. The controller is in a first state is responsive to a logic state of the externally accessible configuration terminal to control the format of the digital audio stream or the programmable configuration setting. In a second state, the controller is configured for receipt and reading of the first configuration data through the externally accessible configuration terminal and the serial data receipt interface.

BACKGROUND OF THE INVENTION

Minimal size and a minimal number of external terminals or pins are important performance measures for integrated audio amplification circuits for application in miniature capacitor or condenser microphones such as ECM and MEMS condenser microphones. These types of condenser microphones are designed for capture and processing of sound in numerous portable devices and applications such as mobile terminals, personal computers, hearing instruments, headsets, sound recording cameras etc. These miniature condenser microphones typically provide very limited housing space for accommodating integrated audio amplification circuits.

Furthermore, these applications are normally cost sensitive. Since manufacturing costs of an integrated semiconductor circuit are largely proportional to the size of the integrated circuit, there is a considerable advantage in minimizing the number of pads or terminals of the integrated circuit due to the associated die area consumption. Likewise, simplification of audio signal processing and data communication interface circuitry of the integrated audio amplification circuit is also of considerable interest because this reduces die area consumption and therefore manufacturing costs as well. The data communication interface circuitry may comprise a programming interface allowing an external application processor, like a general purpose microprocessor or Digital Signal Processor, to set or modify programmable configuration settings of a signal processor or an audio output format of the integrated audio amplification circuit. The programming interface allows the external application processor to control operational characteristics of the integrated audio amplification circuit by changing the programmable configuration setting and adapt the operational characteristics to requirements of a particular application or a particular operational state, e.g. a power down state.

Furthermore, there is a continued increase in the number of microphones utilized in the portable devices. The application of multiple microphones is advantageous to support various types of sophisticated audio signal processing like stereo sound recording, beam-forming, wind noise cancellation etc. However, the use of multiple microphones in portable devices tend to increase the number of external data input/output terminals, increase the amount of data wiring, increase the complexity of data transmission and receiving interfaces, increase complexity of associated data protocols etc. This is generally undesirable because these factors tend to increase the size and manufacturing costs of both the integrated audio amplification circuits and the portable device in which the circuits are incorporated.

PRIOR ART

Existing microphone amplification circuits for miniature condenser microphones comprise one or more externally accessible pads or terminals that can be used to set a static configuration setting of the microphone amplification circuit. The static configuration setting is controlled by coupling the external terminal(s) to a well-defined electrical potential such as ground, or positive supply voltage, which selects a logic state which corresponds to the desired function. A controller of the microphone amplification circuit is adapted to read the logic state or respective logic states of the one or more externally accessible terminals in connection with power-on. Based on the determined logic states at power-on, the controller determines appropriate configuration settings for the signal processor or data output format. Thereafter, the one or more externally accessible terminals remain inactive. The static configuration setting may for example comprise a Left/Right setting of the audio output format of an I$^2$S digital audio interface of a digital output microphone amplification circuit. The I$^2$S digital audio interface transmits a digital audio stream which comprises processed and digitized representations of a sound or audio input signal supplied by a capacitive transducer element of the miniature condenser microphone. Other static configuration settings may be a performance mode setting.

However, if it is desired to control a large number of parameters of the static configuration setting of the microphone amplification circuit by this type of external terminal programming mechanism, the number of externally accessible terminals will rapidly reach an impractical number for the reasons outlined above. Hence, it would be desirable to enhance the functionality of these externally accessible configuration terminals by a dynamic mechanism which at one hand is compatible with known static configuration setting techniques while at the other hand providing additional interface functionality. This has been achieved in accordance with a first aspect of the present invention wherein the externally accessible terminal in addition to its logic state based control of the static configuration setting of the signal processor of the microphone amplification circuit also provides a serial data receipt interface. The serial data receipt interface allows an external application processor to program the integrated audio amplification circuit by changing the programmable configuration setting. In a particular advantageous embodiment, the serial data receipt interface comprises an asynchronous single-wire data communication interface working according to established UART principles.

According to a second aspect of the present invention, a pair of integrated microphone amplification circuits is coupled in cascade between a general purpose I/O port of an external application processor, such as a programmable DSP, through a single wire data bus. The data protocol supports transmission and receipt of configuration data and digital audio signals for both of the integrated microphone amplification circuits through a single wire data bus so as to establish a very compact data communication interface with minimal use of external pins/terminals and circuit board wiring.

SUMMARY OF THE INVENTION

A first aspect of the invention relates to an audio amplification circuit comprising an input terminal for receipt of an input signal from a transducer. A signal processor is operatively coupled to the input terminal for receipt and processing of the input signal to generate a processed digital audio signal in accordance with a programmable configuration setting of the signal processor. A serial data transmission interface is configured for receipt of the processed digital audio signal and generation of a corresponding digital audio stream at an output terminal of the integrated audio amplification circuit. A serial data receipt interface is operatively coupled to an externally accessible configuration terminal of the integrated audio amplification circuit and a controller is configured to adjust one of the programmable configuration setting of the signal processor and a format of a digital audio stream in accordance with first configuration data received through the serial data receipt interface. The controller is in a first state is responsive to a logic state of the externally accessible configuration terminal to control the format of the digital audio stream or the programmable configuration setting. In a second state, the controller is configured for receipt and reading of the first configuration data through the externally accessible configuration terminal and the serial data receipt interface.

The transducer preferably comprises a capacitive transducer element of a capacitive or condenser microphone wherein the transducer is responsive to impinging sound on the microphone and generates a corresponding transducer signal. The transducer signal is accordingly the input signal of the integrated audio amplification circuit. The capacitive microphone may comprise a miniature ECM or a microelectromechanical (MEMS) condenser microphone shaped and sized for mobile terminal applications.

The signal processor preferably comprises preamplifier with a differential or single-ended input coupled to the transducer through the input terminal of the audio amplification circuit. A feedback network may be coupled between an output of the preamplifier and the single-ended or differential input. To minimize input signal loss in connection with the loading of the capacitive transducer element, input impedance at the input of the preamplifier is preferably larger than 100 MΩ, preferably larger than 1 GΩ, even more preferably larger than 10 GΩ, measured at 1 kHz.

The serial data transmission interface preferably comprises a standardized digital audio interface such as I²S, S/PDIF, AES/EBU, SLIMbus™ such that the digital audio stream is formatted in an industry standard compliant manner which simplifies interoperability with external application processors such as a microprocessors and DSPs. Alternatively, the serial data transmission interface may operate according to be a proprietary data transmission protocol. In one such embodiment, the serial data transmission interface transmits the processed digital audio signal directly to the output terminal for example coded a one-bit pulse density modulated (PDM) signal stream outputted by a sigma-delta analog-to-digital converter of the signal processor.

The first configuration data are utilized by the controller to control the programmable configuration setting of the signal processor. The programmable configuration setting may be defined by respective parameter values stored in one or more configuration registers accessible to the controller. The first configuration data comprises these parameter values. Initial values of the parameters may be stored in data memory area of the integrated audio circuit accessible to the controller. The controller may at power-on of the integrated audio amplification circuit be adapted to read configuration parameters for an initial configuration setting of the signal processor from the configuration register if the configuration register comprises non-volatile memory. If the configuration register only comprises volatile memory, the configuration data may be written from the external application processor to the controller in connection with system power-on. The controller extracts configuration parameter values from the configuration data and writes these to the configuration register such that a desired configuration setting of the signal processor is loaded at power-on. The configuration parameter values held in the configuration register may be altered during normal operation of the integrated audio amplification circuit by the external application processor. The external application processor can alter the configuration setting of the signal processor by transmitting configuration data with new parameter values to the controller of the audio amplification circuit through its serial data receipt interface. The external application processor may generate and transmit the first configuration data to the controller through a suitable serial communication interface connected to the serial data receipt interface of the integrated audio amplification circuit. The first configuration data are preferably formatted by the external application processor in accordance with a predetermined serial data protocol, preferably a protocol that supports data communication through a single wire, e.g. a UART based data protocol. According to one such embodiment, the controller is configured for reading the first configuration data formatted according to a serial data protocol comprising:

a pre-amble with a predetermined number of bits, a register address of a configuration register of the programmable configuration setting of the signal processor, a parameter value of the configuration register.

The data signal, carrying the first configuration data formatted according to the predetermined data protocol, is preferably encoded in a simple proprietary manner to provide a data signal which the external application processor can generate with low computational overhead. The data signal may comprise a single-edge or double-edge pulse density modulated signal and the controller configured to read this single or double-edge pulse density modulated signal through the serial data receipt interface. These types of single-edge and double-edge pulse density modulated signals may advantageously be generated by the external application processor through a general purpose I/O port rather than industry standard compatible data communication interfaces or ports such as I²C, SPI interfaces etc. The use of such general purpose I/O port for configuration data transmission is helpful in reducing computational resources involved in the handling of the above-mentioned relatively complex industry standard data interfaces.

The externally accessible configuration terminal controls the format selection of the digital audio stream and/or the programmable configuration setting of the signal processor during the first state of the controller in accordance with the present aspect of the invention. In addition, the externally accessible configuration terminal is coupled to the serial data receipt interface allowing receipt of the first configuration data through the same pin or terminal in the second state of the controller. In the second state the controller is insensitive to the logic state of the externally accessible configuration terminal with respect to the format selection of the digital audio stream and/or the programmable configuration setting. Consequently, the functionality of the externally accessible configuration terminal differs between the first and second controller states such that a single external terminal provides multiple functions. This feature is beneficial because it reduces the number of external terminals or pads of the audio amplification circuit. This feature also reduces the amount of electrical wiring required to connect the audio amplification circuit to an external application processor such as a DSP. Furthermore, due to the provision of the first controller state the audio amplification circuit remains at power-on responsive to the logic state of the externally accessible configuration terminal. Hence, allowing the present audio amplification circuit to operate in a backwards compatible manner with a functionality similar to the above described prior art circuits with static configuration settings.

The format selection of the digital audio stream may be utilized in connection with an $I^2S$ compliant serial data transmission interface or any other dual-channel transmission interface supporting a first data channel and a second data channel. The controller may therefore be configured to encode the processed digital audio signal on the first or the second data channel in accordance with the logic state of the externally accessible configuration terminal during the first state. Hence, by selecting the logic state of the externally accessible configuration terminal the controller may determine whether the digital audio stream is delivered in the left channel or right channel of $I^2S$ frames of the digital audio stream. Thereby, a pair of identical integrated audio amplification circuits can be coupled to a shared $I^2S$ bus and deliver a dual-channel or stereo digital audio stream to the external application processor.

In other embodiments, the selected logic state of the externally accessible configuration terminal is utilized to determine the programmable configuration setting of the signal processor. The programmable configuration setting controls audio processing characteristics of the signal processor such as respective bias voltage and currents of amplification and integrator circuits of the signal processor, activation or interruption of signal processing circuits and elements, sampling frequency of an analog-to-digital converter, DC bias voltage of voltage pumps etc. In one embodiment the programmable configuration setting controls a plurality of configuration parameters setting the audio processing characteristics of the signal processor such that a particular performance mode out of several available performance modes of the signal processor is selected. The performance modes may comprise a high performance mode and a reduced performance mode of the signal processor. The dynamic range of the signal processor is larger in the high performance mode than in the reduced performance mode albeit at the expense of higher power consumption. Hence, an application specific trade-off between performance and power consumption can be selected by selection of the logic state of the externally accessible configuration terminal.

The skilled person will understand that numerous mechanisms may be used to switch the controller from the first state to the second state. According to a preferred embodiment, the controller is configured to:

select the first state for a predetermined time period in response to power-on of the integrated audio amplification circuit; and automatically switch to the second state after expiry of the predetermined time period. The power-on may conveniently be detected by the controller from a state switching of a power-on-reset (POR) signal of the integrated audio amplification circuit. The setting of the predetermined time period may be based on a suitable timer associated with the controller. The timer may be activated by the power-on reset signal and indicate the end of the predetermined time period to the controller at timer expiry. Alternatively, the controller may be configured to detect activation of a clock signal. In this embodiment, the controller may select the first state for a predetermined time period after receipt of the clock signal supplied through a clock input terminal of the integrated audio amplification circuit. The controller is preferably configured to automatically switch to the second state in response to expiry of the predetermined time period. The latter period may be controlled by the above-described timer. In yet another embodiment, the controller is also configured to select the first state for a predetermined time period in response to power-on of the integrated audio amplification circuit. However, in the present embodiment, the controller switches to the second state in response to receipt of the above mentioned clock signal supplied through the clock input terminal. The clock signal may be a master clock signal of the integrated audio amplification circuit that is supplied by the external application processor. In this manner, the external application processor can control the duration of the predetermined time period by controlling a delay between the application of DC supply voltage to the integrated audio amplification circuit and the on-set of the master clock signal. The external application processor may furthermore also control the application of DC supply voltage to the integrated audio amplification circuit allowing for even more accurate control of the duration of the predetermined time period.

The controller is preferably configured for asynchronous reading of the first configuration data through the serial data receipt interface in the second state of the controller. This simplifies the interface between the external application processor and the integrated audio amplification circuit. In the alternative, the controller may be configured for synchronous reading of the first configuration data through the serial data receipt interface in the second state. This embodiment is particularly advantageous if the integrated audio amplification circuit already is coupled to the above-described clock signal supplied by the external application processor.

Another aspect of the invention relates to semiconductor die or substrate comprising an audio amplification circuit according to any of the above described embodiments thereof. The semiconductor die is preferably fabricated in a sub-micron CMOS semiconductor process to allow large scale manufacturing of the audio signal amplification circuit at very low costs.

A still further aspect of the invention relates to a miniature capacitive or condenser microphone comprising a capacitive transducer element responsive to impinging sound to generate a corresponding transducer signal at a transducer signal terminal. The integrated microphone amplification circuit in accordance with any of the above-mentioned embodiments is operatively coupled to the transducer signal terminal via the input terminal of the circuit for receipt and processing of the transducer signal. The miniature capacitive microphone may comprise an electrets condenser microphone (ECM) or a microelectromechanical (MEMS) condenser microphone both preferably shaped and sized for mobile terminal applications.

According to a fourth aspect of the invention there is provided an integrated audio amplification circuit which comprises a serial data transmission interface coupled to a data input terminal and a serial data transmission interface coupled to a data output terminal. The serial data transmission interface and the serial data transmission interface can preferably be coupled in cascade during a transparent state thereof to allow passage of channel mode defining data from a first integrated audio amplification circuit to a second daisy chained integrated audio amplification circuit in connection with power-on of the circuits. The serial data receipt interface and the serial data transmission interface both support dual-channel data streams which allow the first integrated audio amplification circuit to pass through configuration data to a second audio amplification circuit encoded on one of the data channels.

According to this aspect of the invention the integrated audio amplification circuit comprising:

an input terminal for receipt of an input signal from a transducer, a signal processor operatively coupled to the input terminal for receipt and processing of the input signal to generate a first processed digital audio signal in accordance with a configuration setting of the signal processor, a serial data receipt interface operatively coupled to a data input terminal for receipt of an incoming dual-channel data stream formatted in accordance with a predetermined serial data protocol, wherein the configuration data comprises at least one of first configuration data associated with the configuration setting of the signal processor and second configuration data associated with a second configuration setting of a second signal processor of a second integrated audio amplification circuit; said second integrated audio amplification circuit being connectable to the integrated audio amplification circuit via a serial data transmission interface and a data output terminal;

the serial data transmission interface configured for transmission of an outgoing dual-channel digital audio stream formatted in accordance with the predetermined serial data protocol;

a controller configured to enter one of a first channel mode and a second channel mode in accordance with a logic state of the data input terminal at power-on of the integrated audio amplification circuit; said controller being further configured to subsequently executing steps of:

reading the incoming dual-channel data stream received through the serial data receipt interface, extracting the first and second configuration data from first and second data channels, respectively, of the incoming dual-channel data stream, writing one of the first and second configuration data to a configuration register of the integrated audio amplification circuit in accordance with the selected channel mode, encoding the first processed digital audio signal on the first data channel of the outgoing dual-channel digital audio stream, encoding one of the second configuration data and the second processed digital audio signal on the second data channel of the outgoing dual-channel digital audio stream in accordance with the selected channel mode.

The skilled person will understand that characteristics of certain circuits of the present integrated audio amplification circuit such as the input terminal, the input signal from the transducer, the signal processor, the first processed digital audio signal and the configuration setting of the signal processor, may be identical to the corresponding features of the above discussed integrated audio amplification circuit in accordance with the first aspect thereof.

According to an preferred embodiment of the present integrated audio amplification circuit the serial data receipt interface and serial data transmission interface comprises a transparent state coupling the data input terminal to the data output terminal via an inverter for a predetermined time period in response to power-on of the integrated audio amplification circuit. The controller is configured to read the logic state of the data input terminal in the transparent state to select one of the first and second channel modes. Furthermore, the transparent state allow the logic state of the data input terminal of the first integrated audio amplification circuit at power-on to be passed onto the data input terminal of the second daisy chained integrated audio amplification circuit in inverted format by a simple mechanism. For example by adding an inverter to an appropriate position in the transparent data pathway between the serial data receipt and transmission interfaces. Hence, the logic state of the respective data input terminals of the first and second daisy chained integrated audio amplification circuits are opposite during the transparent state. Thereby, the controller of the second audio amplification circuit will select an opposite channel mode relative to the channel mode selected by the controller of the first audio amplification circuit.

The transparent state may be entered in response to a power-on-reset signal of the integrated audio amplification circuit to exploit an already existing signal and eliminate additional hardware. The transparent state may be terminated in various ways for example in response to a clock signal supplied through a clock input terminal of the integrated audio amplification circuit. The latter mechanism will allow an external application processor such as a DSP to control the length of the predetermined time period in a very efficient manner if the external application processor already supplies the clock signal to the integrated audio amplification circuit. The transparent state may be terminated in response to on-set of the clock signal or after a certain delay relative to the on-set of the clock signal. The delay may be defined as a certain number of clock cycles of the clock signal etc.

The clock signal may function as a master clock signal of the integrated audio amplification circuit such that a common type of existing clock signal may be exploited. According to an alternative embodiment, the controller is configured to automatically terminate the transparent state after expiry of the predetermined time period. The predetermined time period may be set e.g. by a dedicated or general purpose timer available to the controller or integrated together with the controller.

The predetermined serial data protocol of the incoming dual-channel digital audio streams may comprise first and second unique preambles indicating the first and second configuration data, respectively, to the controller. The first configuration data and/or the second configuration data may comprise register addresses and corresponding configuration parameter values for the configuration setting of the signal processor.

Each of the incoming dual-channel digital audio stream and the outgoing dual-channel data stream preferably comprises a double-edge pulse density modulated data signal encoding the first data channel one of a leading edge and a trailing edge of the data signal and encoding the second data channel on an opposite edge. This is a proprietary type of data signal that can be efficiently generated by common types of general purpose ports of the external application processor with a low computational overhead.

A final aspect of the invention relates to a sound processing assembly comprising a circuit board. The circuit board comprises first and second audio amplification circuit according to any embodiments of the above described fourth aspect of the invention. A first data wire is electrically connecting the data output terminal of the first audio amplification circuit to the data input terminal of the second integrated audio amplification circuit. A digital signal processor comprises a first general purpose input-output (I/O) port operatively coupled to the data input terminal of the first audio amplification circuit through a second data wire of the circuit board for transmitting the incoming dual-channel serial data stream to the first audio amplification circuit in accordance with the predetermined serial protocol; a second general purpose input-output port operatively coupled to the data output terminal of the second audio amplification circuit through a third data wire of the circuit board for receipt and read-in of the outgoing dual-channel digital audio stream supplied by the serial data transmission interface of the second audio amplification circuit.

BRIEF DESCRIPTION OF THE DRAWINGS

Embodiments of the invention will be described in more detail in connection with the append drawings in which.

DESCRIPTION OF PREFERRED EMBODIMENTS

Figure 1:
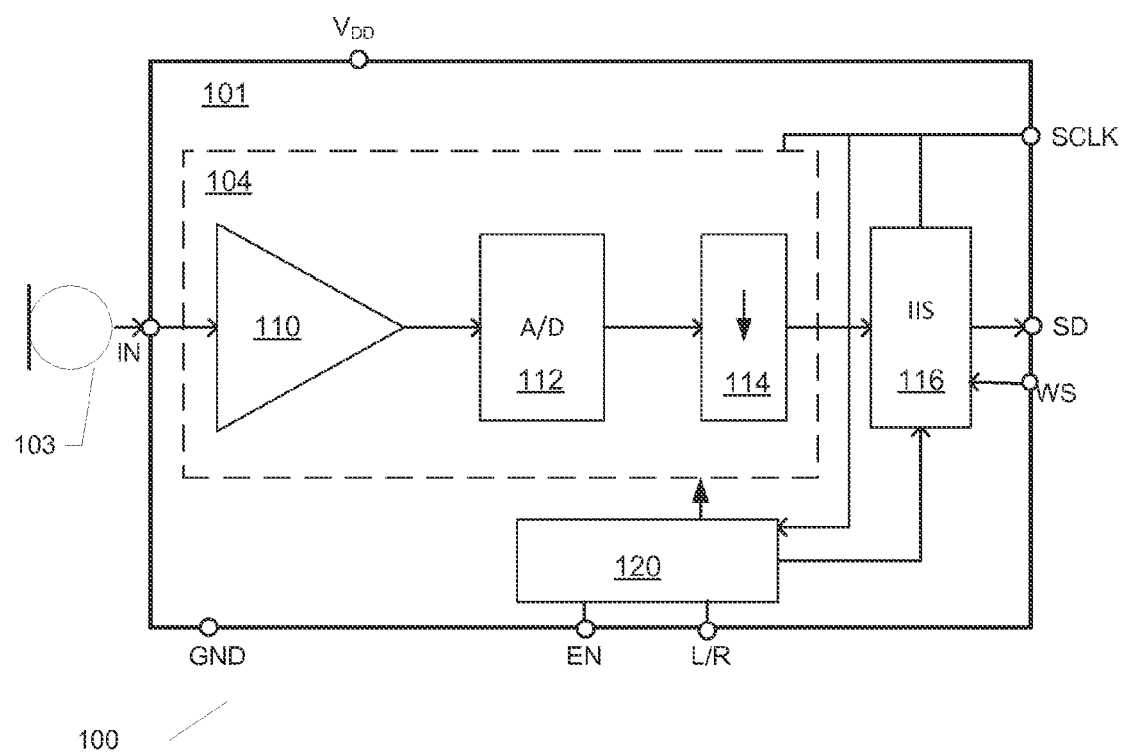
FIG. 1 is a schematic circuit diagram of an integrated microphone amplification circuit according to a first embodiment of the invention.

FIG. 1 is a schematic drawing of an integrated microphone amplification circuit 101 according to a preferred embodiment of the invention coupled to a capacitive transducer element (not shown) held inside a miniature condenser microphone capsule 103. The integrated microphone amplification circuit 101 may serve as an amplifying and digitizing front-end of an associated DSP based sound processing circuit assembly and system as described in further detail below in connection with FIGS. 2 & 3. The integrated microphone amplification circuit 101 is preferably fabricated or implemented on a single CMOS semiconductor die. The skilled person will appreciate that the integrated microphone amplification circuit 101 may be sized and shaped for placement in a miniature microphone housing or capsule of a variety of different types of condenser microphones e.g. a micro-electromechanical (MEMS) condenser microphone, e.g. shaped and sized for mobile terminal applications The integrated microphone amplification circuit 101 comprises a signal processor or signal conditioner 104 interfacing at its input side to the miniature condenser microphone capsule 103. The signal processor 104 generates a processed digital audio signal, in accordance with a programmable configuration setting of the signal processor 104, and supplies the processed digital audio signal to a serial audio data interface 116. The serial audio data interface 116 may comprise an industry standard I²S audio interface or proprietary audio interface. The signal processor 104 comprises a preamplifier 110 which has an input terminal or node IN coupled to the capacitive transducer element (not shown) arranged inside the miniature condenser microphone capsule. The preamplifier 110 may be implemented as a non-inverting operational amplifier to provide very large input impedance at the input node or terminal of the preamplifier 110. This is beneficial because capacitive electret or condenser transducer elements of miniature condenser microphones such as MEMS condenser microphones or ECMs exhibit extremely large generator impedances, essentially corresponding to a capacitor with a value between 0.5 and 2 pF. To avoid input signal loss, the preamplifier input is preferably configured with input impedance larger than 100 MΩ, preferably larger than 1 GΩ, even more preferably larger than 10 GΩ, measured at 1 kHz. The signal processor 104 further comprises a sigma-delta analog-to-digital converter 112 coupled to an output of the preamplifier 110. The sigma-delta analog-to-digital converter 112 is configured to digitize an amplified and buffered microphone signal delivered at an output of the preamplifier 110. A decimation filter 114 is included to convert a one-bit pulse density formatted signal stream of the sigma-delta analog-to-digital converter 112 into the processed digital audio signal. The latter is preferably delivered in multi-bit format, e.g. between 16 bits and 24 bits for example at a sampling rate between 16 kHz and 48 kHz, to a serial audio data interface 116 configured for receipt and formatting of the processed digital audio signal in accordance with a standardized protocol such as I²S, S/PDIF, AES/EBU, SLIMbus™ etc. Alternatively, the serial audio data interface 116 may be adapted to a proprietary data protocol. In one such embodiment, the one-bit pulse density modulated (PDM) signal stream outputted by the sigma-delta analog-to-digital converter 112 is conveyed directly to the external output terminal SD. Hence, the decimation filter 114 may be eliminated and the serial audio data interface 116 configured as a bypass or transmission buffer without performing any formatting of the processed digital audio signal. In this embodiment, the outgoing digital audio stream is formed by a non-decimated or 'raw' PDM signal stream. The use of a PDM signal stream is explained in further detail below in connection with a system aspect where a pair of amplification circuits is daisy chained.

A digital audio stream encoding the condenser microphone signal is accordingly delivered by the serial audio data interface 116 at the externally accessible output terminal or pad SD of the integrated audio amplification circuit 101. The operation of digital logic of the signal processor 104 of the integrated audio amplification circuit 101 is controlled by a master clock signal input received through the externally accessible terminal or pad SCLK. The master clock signal is generated by an external application processor for example a programmable Digital Signal Processor (DSP) coupled to the serial audio data interface 116 through the output terminal SD and controlling configuration of the integrated audio amplification circuit 101 as described below. The master clock signal may have a frequency between 1 and 5 MHz for typical applications. Respective clock signals for the sigma-delta analog-to-digital converter 112 and the decimation filter 114 are derived from the received master clock signal. Clock signals for the I²S serial audio data interface 116 are also derived from the master clock signal and audio samples of the digital audio stream delivered synchronously thereto through the output terminal SD. A supply voltage terminal $V_{DD}$ is used for supplying power to the integrated audio amplification circuit 101. The nominal supply voltage will depend on requirements of any specific application, but may be situated between 1.5 V and 3.0 V DC for typical portable terminal applications. The skilled person will appreciate that the amplification circuit 101 may comprise additional hardware blocks for example a voltage pump for generation of a DC bias voltage for the associated miniature condenser microphone. The integrated audio amplification circuit 101 comprises a controller 120 which may comprise a hard-wired digital state machine, for example comprising customized combinatorial and sequential logic circuitry, or a programmable microprocessor kernel, such as an ARM-core. The skilled person will appreciate that the controller 120 may comprise a combination of the hard-wired digital state machine and the programmable microprocessor kernel. The controller 120 is configured to adjust the programmable configuration setting of the signal processor 104 and the format of the digital audio stream supplied through the I$^2$S in accordance with configuration data received through a serial data interface coupled through an external L/R channel select pad or terminal L/R. The external L/R terminal additionally functions as an external configuration terminal for selecting the format of the digital audio stream such that the audio data is delivered in either a left channel or a right channel of the I$^2$S frame of the digital audio stream depending on a logic state of the L/R terminal. Hence, a pair of identical integrated audio amplification circuits can be coupled to a shared I$^2$S bus and deliver dual-channel or stereo audio data to the Digital Signal Processor (DSP). The above dual functionality of the L/R terminal is achieved by configuration or adaptation of the controller 120 where the controller has first and second states with different functionality. In the first state the controller 120 is responsive to the logic state of the L/R terminal while the controller is configured for receipt and reading of configuration data through a serial data interface coupled to the L/R terminal in the second state. Hence, in the first state the L/R terminal or pin functions similarly to existing microphone amplification circuits and the channel configuration of the circuit may be chosen by connecting the L/R terminal to the appropriate electrical potential through a suitable pull-up or pull-down resistance. However, the present the controller 120 includes the second state where the L/R terminal functions as data input terminal of the serial data interface. The skilled person will appreciate that the serial data interface may be an asynchronous single-wire interface working according to established UART protocols requiring no further external configuration terminal(s) of the integrated audio amplification circuit 101 to form the serial data interface. The transition between the first and second states of the controller 120 may be effected in numerous ways. In a preferred embodiment, the controller 120 is configured to select the first state for a predetermined time period in response to power-on of the integrated audio amplification circuit 104 or amplification circuit 104 and automatically switch to the second state after expiry of the predetermined time period. The power-on may be detected by the controller 120 from a state or transition of a power-on reset signal supplied by a reset generator of the circuit 104. The predetermined time period may be set to a value between 0 and 500 milliseconds such as between 100 and 250 milliseconds. In this embodiment, the controller 120 may be adapted to read the logic state of the L/R terminal in connection with a power up and configuration sequence of the amplification circuit 104 and determine the appropriate configuration of the I$^2$S formatted digital audio stream. Once, this is done, the controller 120 proceeds automatically to the second state where the controller 120 ignores the logic state or state transitions of the L/R terminal for the purpose of configuring the I$^2$S formatted digital audio stream. The controller comprises an asynchronous single-wire interface (not shown) working according to established UART protocols which allows the controller to read the configuration data to define or change the programmable configuration setting of the signal processor 104. The state switching between the first and second states in connection with power-on and the operation of the asynchronous single-wire interface is described in additional detail below in connection with a circuit diagram of the L/R terminal interface circuitry of the controller of the second embodiment of the invention.

The configuration data may include one or numerous configuration parameters of the programmable configuration setting of the signal processor. Each configuration parameter of the programmable configuration setting is preferably stored in an individually addressable register or memory address associated with the controller 120. In a preferred embodiment, the configuration data are utilized to select between at least two different power consumption settings of the signal processor 104. In the first programmable configuration setting, the signal processor enters a first power mode which defines a first power consumption of the signal processor and in a second programmable configuration setting the signal processor enters a second power mode which defines a second power consumption of the signal processor 104. The first power consumption is larger than the second power consumption for example 50% or 100% larger. The skilled person will appreciate that that the first power mode may be a normal operation mode where the signal processor 104 works with nominal or full audio signal processing performance. The second power mode may either be a reduced performance mode, where the microphone signal continues to be amplified, digitized and outputted albeit with reduced performance compared to the first power mode. Alternatively, the second power mode may comprise a standby or power-down mode where audio signal processing is interrupted. The reduced performance mode may comprise a lower signal-to-noise ratio and/or, a lower bandwidth of the outputted digital audio stream. This may be achieved in numerous ways for example by controlling the appropriate parameters of certain configuration registers. These configuration registers may comprise volatile or non-volatile memory such as RAM locations or registers of the controller. The configuration registers may hold respective configuration parameters defining currents or voltages of active components and/or values of passive components of the signal processor 104. These include bias current settings of integrator stages of the sigma-delta analog-to-digital converter 112, a clock frequency of the sigma-delta analog-to-digital converter 112 and parameters defining bias current settings of the preamplifier 110 etc.

Figure 2:
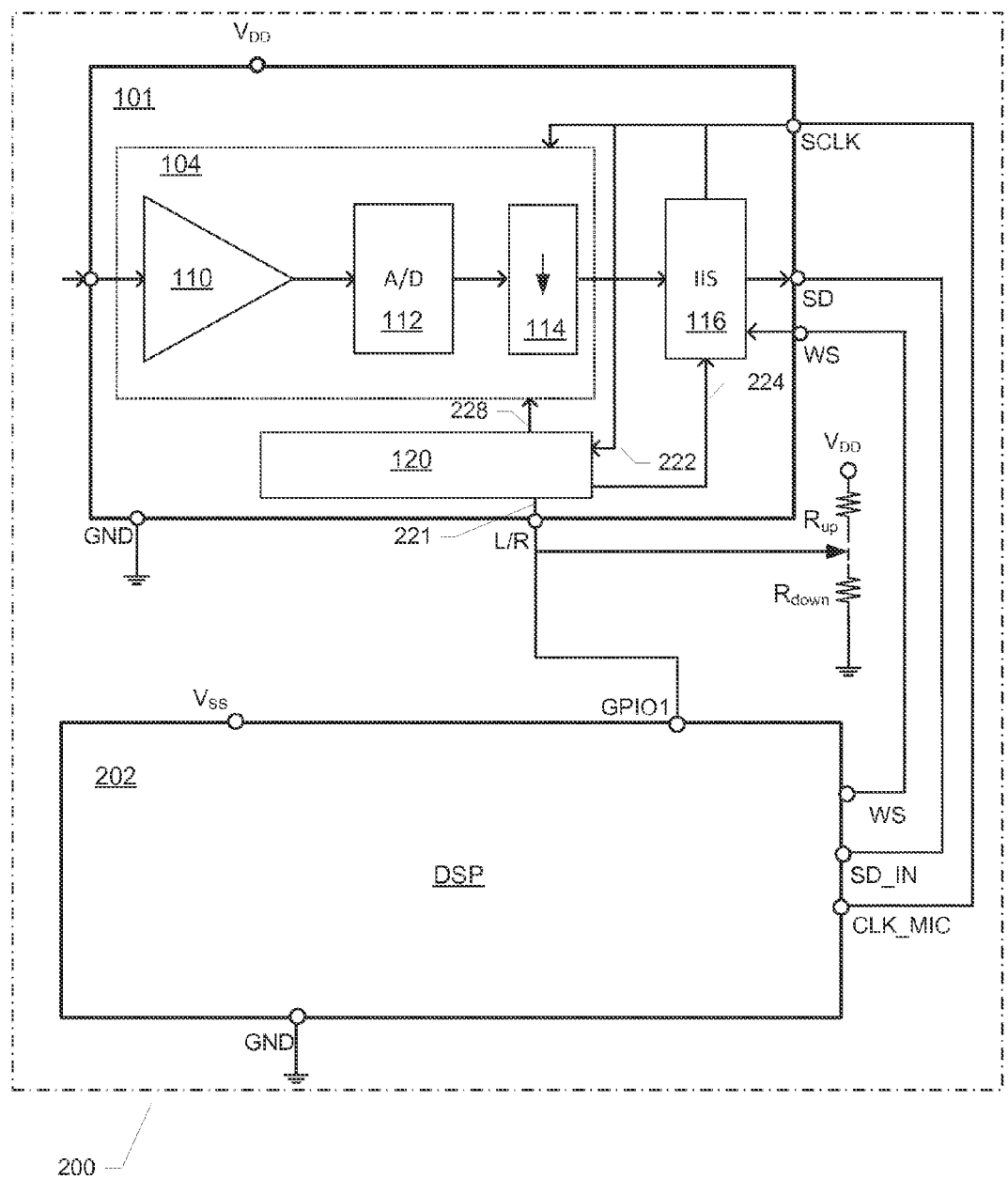
FIG. 2 is a schematic circuit diagram of an integrated microphone amplification circuit according to a first embodiment of the invention coupled to an external DSP processor.

FIG. 2 is a simplified schematic circuit diagram of a sound processing circuit assembly 200 which comprises the above disclosed integrated audio amplification circuit 101. The sound processing circuit assembly 200 may comprise a suitable carrier such as a printed circuit board having various components such as the integrated audio amplification circuit 201 and the programmable DSP 202 attached thereon by soldering or any other suitable mounting technique like wire bonding etc. The programmable DSP 202 comprises terminals V$_{SS}$ and GND for receipt of a power supply voltage. The programmable DSP 202 comprises clock signal terminal CLK_MIC that supplies a master clock signal to the clock input terminal or master clock input pad SCLK of the amplification circuit 201 as discussed above. This master clock signal is generated by the programmable DSP 202 preferably by division from a system clock signal supplied to the DSP 202 from a suitable clock generator (not shown). The provision of the master clock signal SLCK to the amplification circuit 201 from the DSP 202 allows internal clock signals and data bits of the serial audio stream delivered through external terminal SD of the amplification circuit 101 to be synchronous to the clock of the DSP 202. The frequency of the master clock signal will vary according to the requirements for a particular application. The digital circuitry of the amplification circuit 201 is preferably configured for a nominal clock frequency for example between 1 MHz and 10 MHz. In the present embodiment, the digital audio stream transmitted by the amplification circuit 101 is formatted according to the industry standard I²S protocol and read by the DSP 202 through terminal SD_IN of its I²S interface. The DSP 202 furthermore generates a serial data word select signal WS to the I²S serial audio data interface 116 of the amplification circuit 101 in accordance with the I²S protocol. However, the skilled person will understand that other types of serial data protocols may be used for transmission of the digital audio stream to the DSP 202 such as the previously discussed one-bit pulse density modulated (PDM) signal stream. The one-bit pulse density modulated (PDM) signal stream may be synchronized to the master clock signal supplied to the amplification circuit 101 on the externally accessible terminal SCLK.

A general output port GPIO1 of the DSP 202 is coupled to the external L/R channel select terminal or L/R terminal of the amplification circuit 101 through suitable electrical wiring on the carrier. The logic state of the L/R terminal can either be set to logic high or logic low by appropriately coupling the L/R terminal to one of the illustrated pull-up and a pull-down resistors $R_{UP}$ and $R_{DOWN}$, respectively. To ensure that the logic state of the L/R terminal is unaffected by the port impedance of the general purpose output port GPIO1, the latter is tri-stated (a high-impedance state) by the DSP 202 during power-on of the amplification circuit 101. Thereby, the logic state of the L/R terminal initially becomes controlled by either the pull-up or pull-down resistor. The controller 120 select the first state for the predetermined time period in response to receipt of the power-on of the amplification circuit 104 as described above. Thereafter, the controller automatically switches to the second state where it is able to read configuration data written by the DSP 302 from the general purpose output port GPIO1 through the serial data interface of the controller 120 operatively coupled to the L/R terminal. The switch from the first state to the second state may be based on a suitable timer of the controller 120 activated by the power-on reset signal. The timer expires at the end of the predetermined time period. In an alternative embodiment, the switch from first state to the second state is controlled by an initial clock pulse of the master clock signal delivered to the controller as discussed below in additional detail in connection with a second aspect of the invention. Each resistance value of the pull-up and pull-down resistors $R_{UP}$ and $R_{DOWN}$, respectively, is preferably much larger than an output impedance of the general purpose output port GPIO1. In this manner, the general purpose output port GPIO1 is capable of effectively controlling the binary data values on the L/R configuration terminal in the second state. The resistance values of each of the pull-up and pull-down resistors may be larger than 100 kΩ, such as between 100 kΩ and 10 MΩ, such that an output impedance in the order of a few kΩ or less of the general purpose output port GPIO1 will allow the latter to control the voltage on the configuration terminal and associated wiring. The serial programming interface comprises an asynchronous single-wire interface working according to UART principles allowing the transmission of the configuration data to the controller 120 without occupying any external pads or terminals of the amplification circuit 101. Furthermore, the single wire interface and the exploitation of the UART based serial data interface minimize consumption of hardware and software resources on the DSP 202. This is because a data protocol on the asynchronous single-wire interface can be very simple leading to a small consumption of hardware and software resources on the DSP 202 in handing this data interface. Furthermore, the above serial programming interface unloads other types of industry standard data communication ports and interfaces of the DSP 202 such as SPI, IIC etc.

Figure 3:
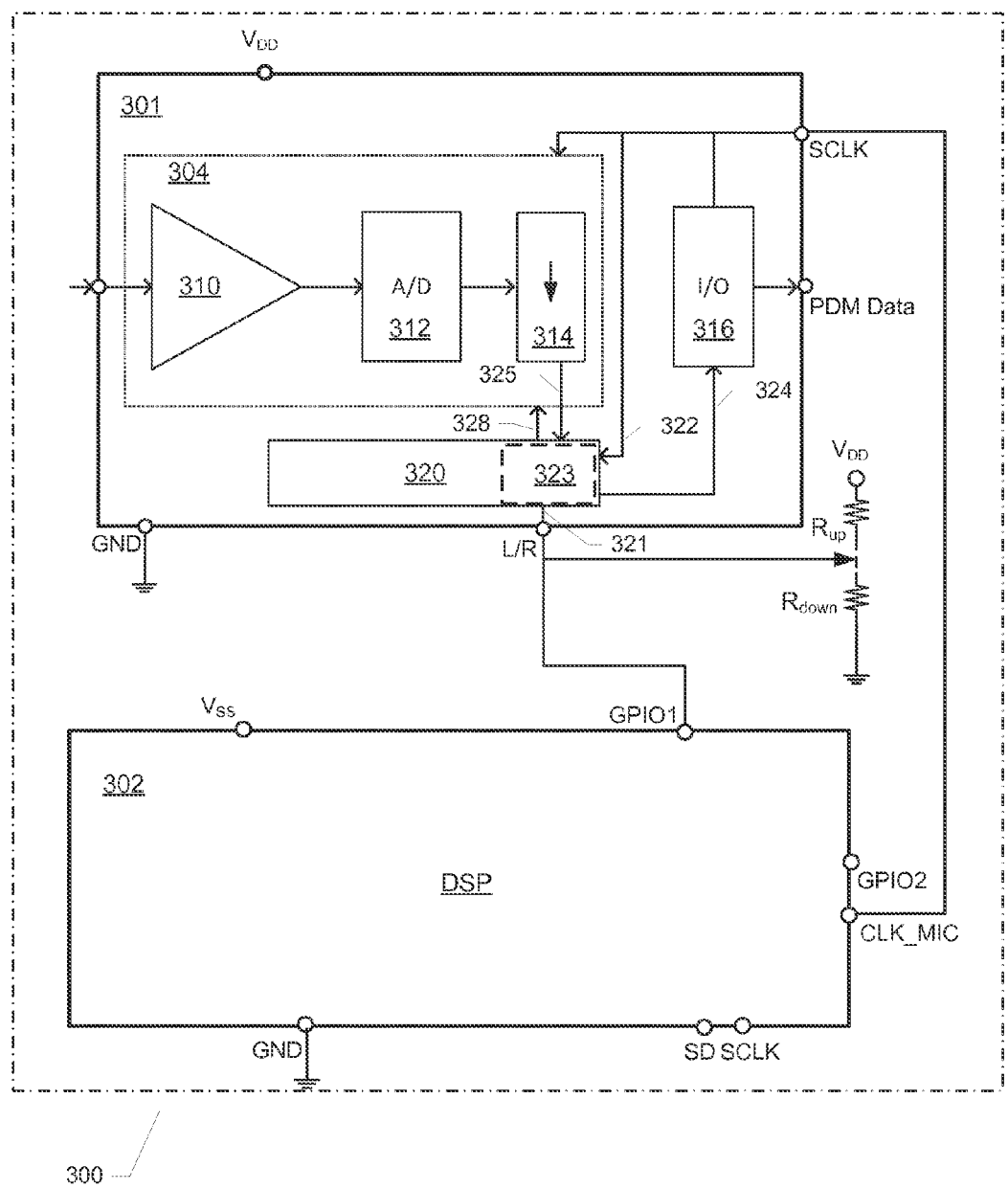
FIG. 3 is a schematic circuit diagram of an integrated microphone amplification circuit according to a second aspect of the invention coupled to an external DSP processor.

FIG. 3 is a simplified schematic circuit diagram of a sound processing circuit assembly 300 according to a second aspect of the invention. The sound processing circuit assembly 300 comprises an integrated audio amplification circuit 301 in accordance with a second embodiment in which the I²S digital audio interface discussed above has been replaced by a customized serial data transmission interface comprising I/O circuit 316. The customized serial data transmission interface is configured for handling a dual-channel digital audio stream carrying both configuration data and processed digital audio signals. The sound processing circuit assembly 300 may comprise a suitable carrier such as a printed circuit board having various components such as the integrated audio amplification circuit 301 and the programmable DSP 302 attached thereon by soldering or any other suitable mounting techniques like wire bonding etc. The programmable DSP 302 comprises terminals $V_{SS}$ and GND for receipt of a power supply voltage. The programmable DSP 302 comprises clock signal terminal CLK_MIC that supplies a master clock signal to the clock input terminal or master clock input pad SCLK of the amplification circuit 301 as discussed above. This master clock signal is generated by the programmable DSP 302 preferably by division from a master clock signal of the DSP 202 such that internal clock signals and data bits of the serial audio stream through external terminal PDM_DATA of the amplification circuit 301 are synchronous to the master clock signal supplied by the DSP 302. The frequency of the master clock signal will vary according to the requirements for a particular application. The digital circuitry of the amplification circuit 301 is preferably configured for a nominal clock frequency for example between 1 MHz and 10 MHz.

A general purpose I/O port GPIO1 of the DSP 302 is coupled to the external L/R channel select terminal or L/R terminal of the amplification circuit 301 through suitable wiring on the carrier schematically illustrated by data wire 321. A serial data receipt interface forms part of the logic circuit assembly 323 of a controller 320 and provides the interfacing to the external L/R terminal. The controller 320 may comprise a hard-wired digital state machine for example comprising customized combinatorial and sequential logic circuitry embodied on an ASIC or a programmable microprocessor kernel, such as an ARM-core. The logic state of the L/R terminal can either be set to logic high or logic low by appropriately coupling the L/R terminal to one of the illustrated pull-up and a pull-down resistors $R_{UP}$ and $R_{DOWN}$, respectively, as discussed above. To ensure that the logic state of the L/R terminal is insensitive to the port impedance of the general purpose I/O port GPIO1, the latter is tri-stated (high-impedance state) by the DSP 302 during power-on of the amplification circuit 301. Hence, the logic state of the L/R terminal may initially be controlled by the selected one of the pull-up and pull-down resistors. In the alternative, the logic state of the L/R terminal may be controller by the general purpose I/O port GPIO1 for example according to a system initialization program executed by the DSP 302. The controller 320 selects a transparent state of the serial data transmission interface and the serial data receipt interface for a predetermined time period in response to receipt of the power-on of the amplification circuit 301. In this transparent state the controller reads the logic state of the logic state of the external L/R terminal and enters a either a first channel mode or a second channel mode in accordance with the detected logic state as explained in detail below in connection with FIG. 4. The subsequent switching to a non-transparent state of the controller 320 where the controller reads the configuration data transmitted from the DSP 302 through the general purpose I/O port GPIO1 is carried out by a different mechanism than the previously discussed timer controlled mechanism. In the present embodiment, the switching from the transparent state to the second state is carried out by on-set of the master clock signal supplied to the controller 320 through clock wire 322 and the master clock input pad SCLK. This is explained in further detail below in connection with FIG. 4. The DSP 302 is configured to generate and transmit a dual-channel digital audio stream through the general purpose I/O port GPIO1 to the controller 320. The dual-channel digital audio stream transmitted to the controller 302 comprises both first configuration data, defining a configuration setting of the signal processor 304, and second configuration data defining a configuration setting of another signal processor of another or second integrated audio amplification circuit (not shown) coupled to the integrated audio amplification circuit 301 through the customized serial data transmission interface and the output terminal PDM data. The first and second configuration data are encoded on different channels of the dual-channel digital audio stream. By evaluating its channel mode, the controller 320 determines which of the first and second configuration data that are addressed to the amplification circuit 301, extracts the appropriate configuration data, and encodes the residual configuration data onto the second channel of the outgoing dual-channel digital audio stream through output terminal PDM data. This feature enables the controller of the second integrated audio amplification circuit to read and extract the second configuration data. The controller 320 writes the extracted configuration data targeted for the same circuit to an appropriate configuration register or registers through the schematically illustrated data bus or wire 328 for storage. Finally, the controller 320 proceeds to a read processed digital audio signal supplied by the signal processor 304 through data wire 325. The controller encodes and adds the processed digital audio signal on the unused channel (the channel of the incoming dual-channel data stream that contained the first configuration data) of the outgoing dual-channel digital audio stream. These features are explained in additional detail below in connection with FIG. 4 and FIG. 5 that illustrate the interconnection between the DSP 302 and a pair of cooperating cascaded integrated audio amplification circuits 301, 303 through a single wire data bus structure.

Figure 4:
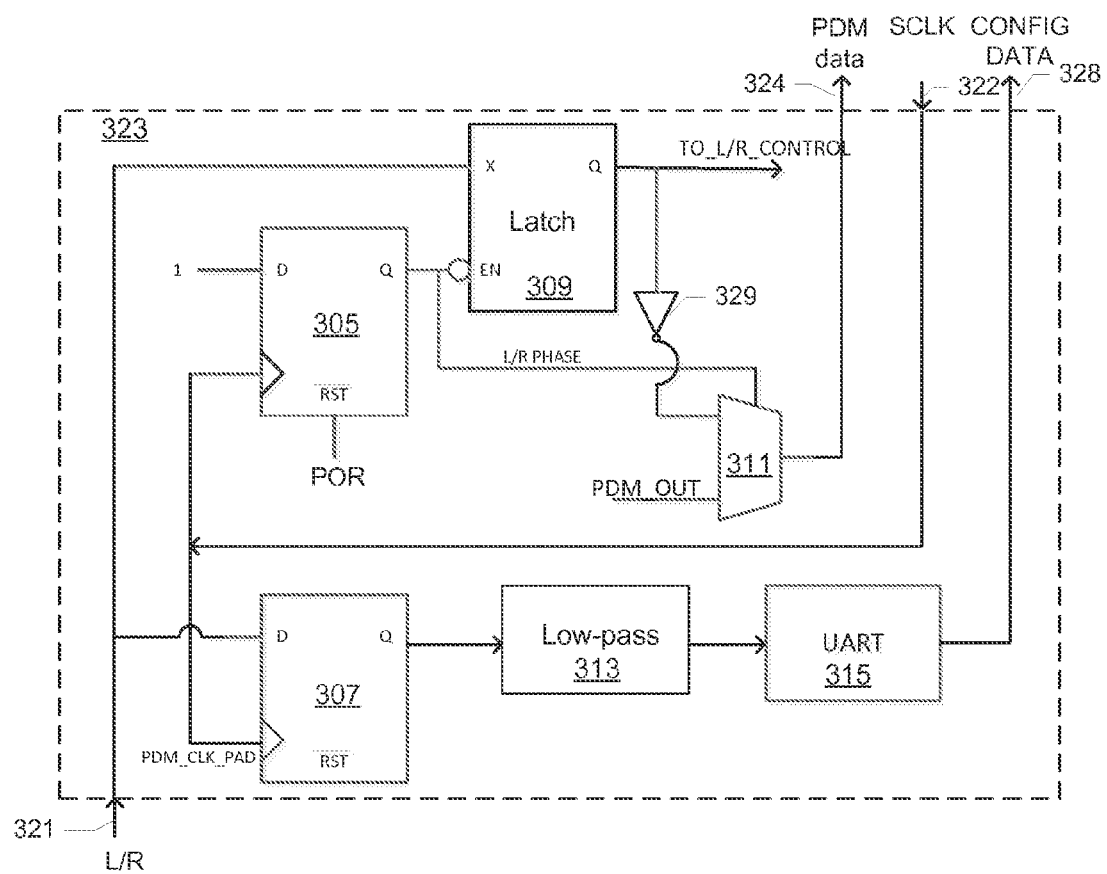
FIG. 4 is a detailed schematic circuit diagram of a logic circuit assembly of the controller according to the second embodiment of the invention.

FIG. 4 is a detailed schematic circuit diagram of the logic circuit assembly 323 comprising the above-mentioned serial data transmission interface and serial data transmission interface both connected to the controller 320. The serial data transmission interface of the logic circuit assembly 323 comprises a latch 309 with a data input X connected to the external L/R terminal and an enable input connected to a data output Q of a standard type of asynchronous reset synchronous set D-FF 305. The reset input of the D-FF 305 is connected to a power-on-reset signal POR of the integrated microphone amplification circuit 301. A clock input of the D-FF 305 is connected to the master clock signal SCLK of the integrated microphone amplification circuit 301. The skilled person will understand that the logic level of the L/R terminal preferably is controlled by the GPIO1 port of the DSP 302 during the transparent state of the serial data transmission interface and serial data transmission interface in connection with power-on of the integrated microphone amplification circuit 301. Thereby, the initial set logic level of the L/R terminal defines the L/R channel mode allocation of the integrated microphone amplification circuit 301. The logic circuit assembly 323 functions at power-on of the integrated microphone amplification circuit 301 to retain the latch 309 in a transparent state by asserting the enable input EN from the Q output of the D-FF 305. In this manner, data content on the L/R terminal, including its logic state or state transitions, is transmitted directly to the output Q of the latch 309. The output Q of the latch 309 is read by the controller 320 as it represents the logic state of the L/R terminal at power-on of the integrated circuit 301. The output Q of the latch 309 is also coupled to a first input of a multiplexer 311 through an inverter 329 such that the opposite logic state to that of the output of latch 309 is passed through to the output of the multiplexer 311. The multiplexer output is selected by the L/R phase signal driven by the Q output of the D-FF 305. Hence, the opposite logic state to that of the output Q of the latch 309 is passed onto the PDM data wire 324 during the transparent state and transmitted to the serial data receipt interface of a second integrated microphone amplification circuit 303 (refer to FIG. 5). Hence, the controller of second integrated microphone amplification circuit 303 will, in connection with power-on, configure the second integrated microphone amplification circuit 303 in the opposite channel mode to that of the first integrated microphone amplification circuit 301.

The switching of the controller 320 from the transparent state to the non-transparent state is controlled by the on-set of the master clock signal SCLK in the present embodiment. The first clock pulse of the master clock signal after the power-on-reset signal POR has been de-asserted clocks the "1" logic level applied to the D input of the D-FF 305 to its output Q leading to disablement of the latch 309. The disablement of latch 309 terminates the transparent state. The skilled person will appreciate that the transparent state of the serial data transmission interface and serial data transmission interface also supports other methodologies of setting the respective modes of the first and second integrated microphone amplification circuit 301, 303. This because various types of mode setting data and commands may be encoded in the dual-channel digital audio stream transmitted by the DSP 302 from port GPIO1 and passed through the serial data interfaces of the first integrated microphone amplification circuit 301 and onto the daisy chained or cascaded second integrated microphone amplification circuit 303 during the transparent state, i.e. until arrival of the first clock pulse of the master clock signal as discussed above. The second integrated microphone amplification circuit is connected in series with the present integrated microphone amplification circuit 301 through the PDM data line 324 and the associated external data terminal PDM Data. This is explained in additional detail in connection with FIG. 5 below.

The multiplexer 311 has a second input coupled to an outgoing dual-channel digital audio stream PDM OUT generated by the controller 320. A select signal of the multiplexer 311 is coupled to the enable input of the latch 309 as previously described. Once the non-transparent state is entered, the Q output of the D-FF 305 forces a change of the logic state of the multiplexer select signal such that the multiplexer 311 switches to pass the outgoing dual-channel digital audio stream PDM OUT to the external data terminal PDM data instead of the data signal on the latch output Q. The outgoing dual-channel digital audio stream is generated by the controller 320 in the non-transparent state thereof. The present integrated microphone amplification circuit 301 is placed closest to the GPIO1 port of the DSP 302 and the first channel of the outgoing dual-channel digital audio stream therefore comprises the processed digital audio signal generated by the signal conditioner 304 while the second channel comprises the extracted second configuration data for second amplification circuit 303 as discussed above. The skilled person will appreciate that the data contained in an outgoing dual-channel digital audio stream of the second integrated audio amplification circuit 303 differs because the latter circuit is configured as right channel mode as described in detail below in connection with FIG. 5.

In yet another embodiment of the invention, the L and R channel modes of the amplification circuits are detected by each controller from observed preamble data content of the respective incoming dual-channel serial data streams received through the respective L/R terminals. In connection with power-on of the first and second amplification circuits, the DSP 302 transmits a unique pre-amble on each of the first and second channels of the dual-channel serial data streams. The pre-amble is organized such that it is distinguishable from the first and second configuration data and from the first and second processed digital audio signals. The pre-amble may be a rare PDM data pattern, preferably repeated, to decrease the likelihood of the pattern is contained in normal processed digital audio signals. The preambles associated with the left/L and right/R modes of the amplification circuits must be different, such that each controller can determine the appropriate left or right mode of its amplification circuit. The L and R mode selections are preferably carried out by a procedure where the controller of the first amplification circuit 301 detects whether received preamble data from the DSP 302 comprises both the first and second preambles. If that is the case, the controller concludes the amplification circuit 301 is set to L mode in the present embodiment. The controller of the first amplification circuit 301 proceeds to extract and write the first configuration data to the first configuration register(s) as described above. The controller of the first amplification circuit 301 proceeds to extract the second preamble and second configuration data and encode these on the second channel of the dual-channel digital audio stream transmitted by the first amplification circuit 301 to the second amplification circuit 303 through the data output terminal SD and data wire 507.

The logic circuit assembly 323 also comprises the serial data receipt interface connected to the external L/R terminal of the integrated microphone amplification circuit 301. The serial programming interface is an asynchronous single-wire data interface operating according to Universal Asynchronous Receiver/Transmitter (UART) principles. The serial programming interface comprises D-FF 307, low-pass filter 313 and UART 315. The incoming dual-channel data stream on the external L/R terminal is applied to the data input D of the D-FF 307 and clocked to the Q output by the master clock signal connected to the clock input of the D-FF 307. The first and second configuration data, or the first processed digital audio signal and the second configuration data, depending on the arrangement of the circuit 301 in the circuit cascade, are extracted bit by bit from the incoming dual-channel data stream by the low-pass filter 313. The low-pass filter 313 may have a cut-off frequency corresponding to about 10-50 clock cycles of the master clock signal to extract the incoming configuration data and processed digital audio signal if these are encoded as the below discussed double-edge pulse density modulated data signal. The UART 315 extracts or separates the first and second configuration data, or the first processed digital audio signal and the second configuration data from the incoming data stream in accordance with the selected data protocol as described in further detail below in connection with FIG. 6. These configuration data and/or processed digital audio signal are transmitted to the controller via configuration data wire 228 and processed in the controller as part of generating the data content of the outgoing dual-channel digital audio stream in dependence on the selected channel mode as described in further detail below.

Figure 5:
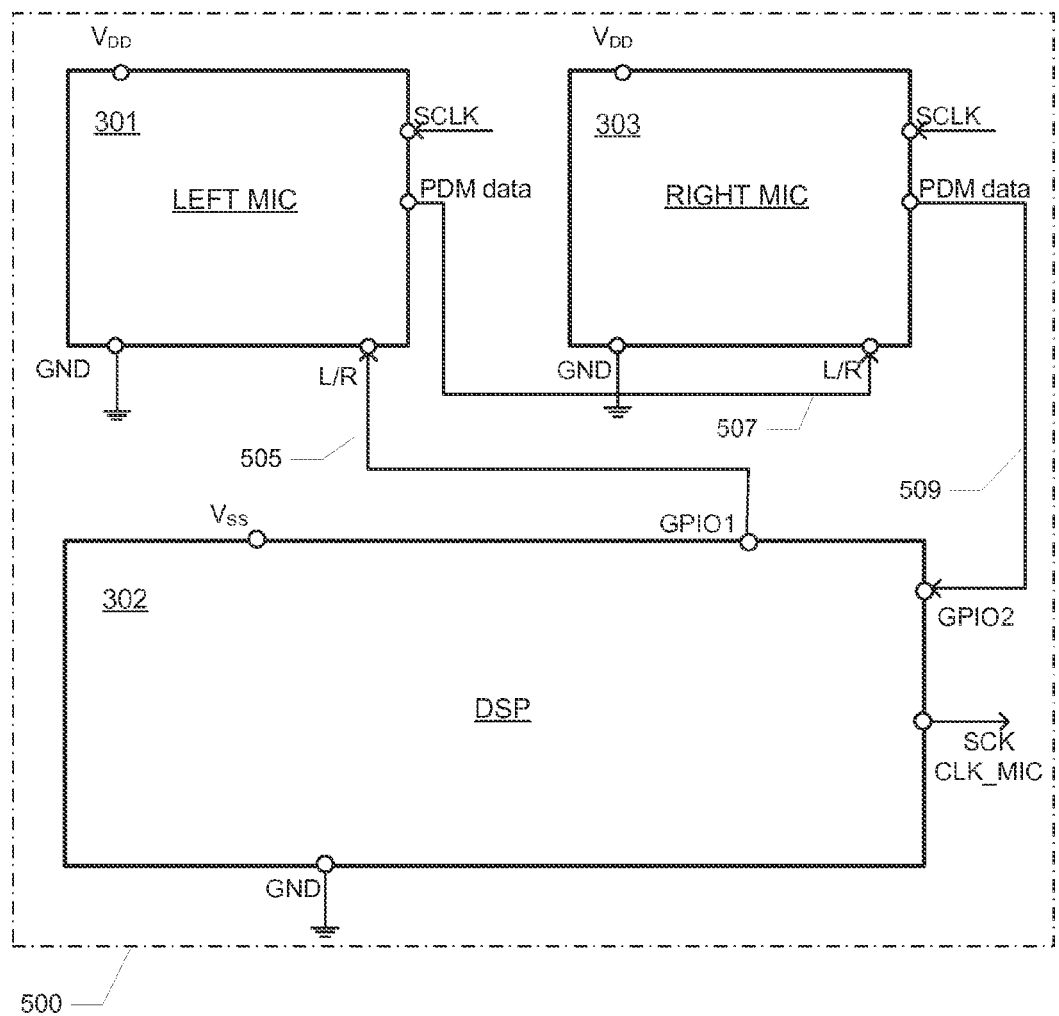
FIG. 5 is a schematic circuit diagram of a sound processing circuit assembly comprising a pair of cooperating integrated microphone amplification circuits according to a second aspect of the invention, FIG. 6A) illustrates how data communication is initialized on an exemplary asynchronous serial data protocol used by a single wire dual-channel serial data receipt interface and dual-channel serial data transmission interface of the integrated microphone amplification circuit according to the second aspect of the invention.

FIG. 5 is a simplified schematic circuit diagram of a sound processing circuit assembly 500 comprising the previously discussed cooperating and daisy-chained pair of integrated audio amplification circuits 301, 303 of the same type, but configured in L channel mode and R channel mode, respectively, by the above-described channel assignment mechanism during the transparent states of the circuits. The pair of integrated audio amplification circuits 301, 303 are coupled to the previously discussed programmable DSP 302 via the first general purpose output port GPIO1 and the second general purpose output port GPIO2 as discussed above. The programmable DSP 302 may in some applications be replaced with another type of external application processor such as a general purpose microprocessor, microprocessor core etc. The sound processing circuit assembly 500 may comprise a suitable carrier (not shown) such as a printed circuit board having various components such as the data signal wiring, first and second integrated audio amplification circuits 301, 303, respectively, and the programmable DSP 302 integrated or attached thereon by soldering or other mounting techniques like wire bonding etc. Each of the first and second integrated audio amplification circuits 301, 303, respectively, comprises an externally accessible data input terminal, using existing respective L/R configuration terminals in the present embodiment, which are connected in cascade through the externally accessible data output terminal PDM Data of the first integrated audio amplification circuit 301. The programmable DSP 302 comprises the clock signal output terminal CLK_MIC that supplies substantially identical master clock signals to the clock input terminals SCLK of the first and second integrated audio amplification circuits 301, 303, respectively, as discussed above. Furthermore, the programmable DSP 302 generates and transmits the previously discussed configuration data, which comprises both first and second configuration data formatted as prescribed by the predetermined data protocol, through the first general purpose output port GPIO1 connected to the first amplification circuit 301 through a single data wire 505. The second general purpose 10 port GPIO2 is used for receiving and reading the first and second digital audio signals encoded on the first and second channels, respectively, of an outgoing dual-channel digital audio stream transmitted from the external PDM Data output terminal of the second amplification circuit 303 (RIGHT MIC). Hence, the respective serial data transmission and receipt interfaces of first and second amplification circuits 301, 303 are effectively coupled in cascade between the general purpose output and input ports GPIO1 and GPIO2 of the programmable DSP 302. In this manner, the respective configuration data can be transmitted to the first and second amplification circuits 301, 303 and the respective processed digital audio signals generated by the first and second amplification circuits 301, 303 transmitted to the DSP 302 through the illustrated single wire data bus.

The single wire data bus occupies only two externally accessible terminals of each of the first and second amplification circuits 301, 303. The skilled person will appreciate that the first and second integrated audio amplification circuits 301, 303 may be coupled to respective condenser microphones (not shown) in a manner similar to the one discussed above in connection with the amplification circuit 101 of FIG. 1. In response to sound on the condenser microphones, the first and second integrated amplification circuits may therefore supply first and second processed digital audio signals, respectively, representing the sound such as speech and music. The first and second processed digital audio signals are transmitted through the respective serial data transmission interfaces and associated data wiring 507, 509. Each of the serial data transmission interfaces is configured for generation of the previously discussed dual-channel digital audio stream outputted through the respective externally accessible data output terminals PDM Data. In the outgoing dual-channel digital audio stream carried on the first data wire 507 the first channel encodes the first processed digital audio signal supplied by the signal processor of the amplification circuit 301 (LEFT MIC) and the second channel encodes the second configuration data for the second amplification circuit 303. In the dual-channel digital audio stream carried on the second data wire 509, the first channel still encodes the first processed digital audio signal while the second channel encodes the second processed digital audio signal supplied by the signal processor of the second amplification circuits 303 instead of the second configuration data.

The type of data encoded on the incoming dual-channel data streams received by the first and second amplification circuits 301, 303 differs during normal operation of the assembly 500 due to their different positions in the cascade arrangement of the circuits 301, 303. The controller of the first amplification circuit 301 reads and extracts both the first configuration data, for the first amplification circuit 301 and second configuration data for the second amplification circuit 303 from the incoming dual-channel data stream. The controller of the first amplification circuit 301 is configured in R channel mode and proceeds therefore to extract the first configuration data, which are associated with the configuration setting of the signal processor of the RIGHT MIC circuit 301 in the present exemplary embodiment, from the received configuration data. The controller writes the first configuration data to either a configuration register which controls the configuration setting of the signal processor or a suitable data memory area for later loading into the configuration register. The controller thereafter proceeds to generate the outgoing dual-channel data stream in accordance with the set R channel mode. The controller reads the first processed digital audio signal from the signal processor as described above and formats the first processed digital audio signal and the already extracted second configuration data and formats these in accordance with the serial data protocol. The first processed digital audio signal is encoded on the vacant first data channel, i.e. vacant because the first configuration data have been extracted, of the outgoing dual-channel data stream while the second configuration data are encoded on the second data channel of the outgoing dual-channel data stream.

The controller of the second amplification circuit 303 proceeds to reading the incoming dual-channel data stream through the serial data receipt interface coupled to the external L/R terminal of the second amplification circuit 303. The controller of the second amplification circuit 303 is configured in L channel mode and proceeds therefore to extract the first processed digital audio signal from the first data channel and the second configuration data from the second data channel. The latter configuration data are associated with the configuration setting of the signal processor of the LEFT MIC circuit 303 in the present exemplary embodiment. The controller writes the second configuration data to either a configuration register which controls the configuration setting of the signal processor or to a suitable data memory area for later loading into the configuration register. The controller thereafter proceeds to generate the outgoing dual-channel data stream in accordance with the set L channel mode. The controller reads the second processed digital audio signal supplied by the signal processor of the LEFT MIC circuit 303. The controller formats the second processed digital audio signal and the already extracted first digital audio signal in accordance with the serial data protocol. The first processed digital audio signal is once again encoded on the first data channel of the outgoing dual-channel data stream while the second configuration data are encoded on the vacant second data channel, i.e. because the second configuration data have been extracted by the controller of the second circuit 303. Hence, the outgoing dual-channel data stream is effectively a dual-channel digital audio stream which is sent through the serial data transmission interface of the second amplification circuit 303 for transmission to the second general purpose I/O port GPIO2 of the DSP 302 through the data wire 509.

Figure 6:
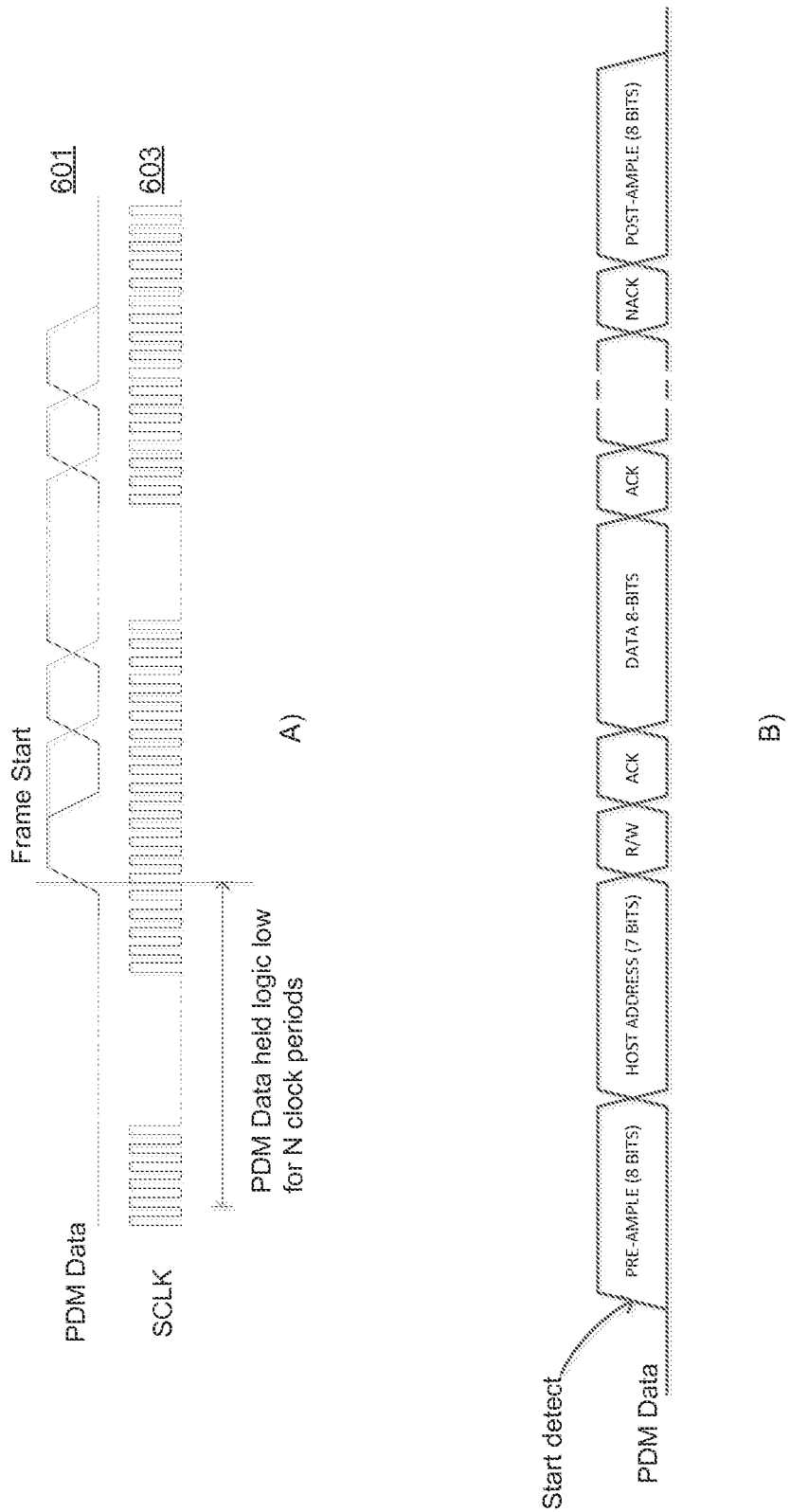
FIG. 6B) illustrates a single data frame structure of the exemplary asynchronous serial data protocol in detail.

As mentioned above, the various outgoing and incoming dual-channel data streams are preferably formatted according to the serial data protocol explained below in connection with FIG. 6. The various outgoing and incoming dual-channel data streams are preferably encoded as double-edge pulse density modulated signals in which the first data channel is encoded on a rising or falling edge of the data signal and the second data channel is encoded on the opposite edge of the data signal. The skilled person will appreciate that the first and second configuration data, the first and second processed digital audio signals are transmitted between the programmable DSP 302 and the first and second amplification circuits 301, 303, respectively, using only a single data wire bus which establish a very compact data communication interface with minimal use of external pins/terminals and board wiring. The skilled person will appreciate that even the master clock signal distributed to the respective SCLK inputs of the first and second amplification circuits 301, 303 does not add overhead to the present single wire data communication interface because the master clock signal is necessary for other purposes in the digital circuitry of the amplification circuits.

FIG. 6A) illustrates how data communication is initialized on an exemplary asynchronous serial data protocol of the above discussed dual-channel serial data streams allowing the exchange of both digital audio data and configuration data between the DSP 302 and the first and second amplification circuits 301, 303 through the above-discussed single wire data interface or data bus comprising data wires 505, 507 and 509. The upper graph 601 shows the dual-channel serial data line or wire PDM Data while the lower graph 603 shows the master clock signal applied to the first and second amplification circuits 301, 303 through the externally accessible terminal or pad SCLK. The transmission of a serial data frame is started or initialized by holding the PDM Data line at a fixed logic state for N clock cycles of the master clock and then switching the PDM Data line to an opposite logic state. FIG. 6B) illustrates a single data frame of the exemplary asynchronous serial data protocol to explain the protocol details. The depicted data frame comprises a preamble of 8 bits which is used to synchronise the serial data communication channel as the bit rate of the channel is initially unknown and a symbol clock rate is required. The preamble is followed by a host address, e.g. 7 bits, which is used to select or address either the first or the second amplification circuit. The host address is followed by a read/write indicator in respect of the data content of current frame and an acknowledge bit, ACK. The acknowledge bit is followed by the above-mentioned data content of the data frame and graphically illustrated as a single byte, DATA, comprising 8-bits of data. The data content of the frame preferably comprises a plurality of data bytes in accordance with the specific details of the selected frame structure of the serial data protocol. The data content may comprise a first byte with a register address and a one or more subsequent data byte(s) holding a register value to be written to the register address in question or alternatively to be read from the register address in question. The register value may set a particular configuration parameter of the signal processor of the selected amplification circuit. The skilled person will appreciate that each of the amplification circuits 301, 303 may comprise a plurality of configuration registers with associated pairs of register addresses and register values to set multiple configuration parameters. The multiple configuration parameters may in combination define the programmable configuration setting of the signal processor e.g. select a particular power mode. A second acknowledge bit is inserted after the data content. During writing of data to the amplification circuit, the end of the data frame is signaled or marked to the controller by transmission of a post-amble byte with a certain bit pattern, POST-AMPLE, as illustrated. During reading of the data content of the configuration register of the amplification circuit, the non-acknowledge bit, NACK, can be used by the controller to indicate to the master device that the intended data reading was unsuccessful. The skilled person will understand that the each configuration register may comprise various forms of volatile and/or non-volatile memory such as registers, data RAM, EEPROM, flash memory etc. for either temporary or permanent storage of the received configuration parameter values. The individual data bits of the transmitted PDM data stream are preferably Manchester encoded because this simplifies clock less data recovery, or possibly the design of clock recovery circuits, because the encoding always provides at least one clock edge per data bit.

The invention claimed is:

1. An integrated audio amplification circuit comprising:
an input terminal for receipt of an input signal from a transducer, a signal processor operatively coupled to the input terminal for receipt and processing of the input signal to generate a processed digital audio signal in accordance with a programmable configuration setting of the signal processor, a serial data transmission interface configured for receipt of the processed digital audio signal and generation of a corresponding digital audio stream at an output terminal of the integrated audio amplification circuit,
a controller configured to adjust one of the programmable configuration setting of the signal processor and a format of the digital audio stream in accordance with first configuration data received through the serial data receipt interface; wherein in a first state the controller is responsive to a logic state of the externally accessible configuration terminal to control at least one of the format of the digital audio stream and the programmable configuration setting,
in a second state the controller is configured for receipt and reading of the first configuration data through the externally accessible configuration terminal and serial data receipt interface,
wherein the controller is configured to select the first state for a predetermined time period in response to power-on of the integrated audio amplification circuit and automatically switch to the second state after expiry of the predetermined time period,
further wherein the controller is configured to read double-edge pulse density modulated configuration data through the serial data receipt interface, a leading edge or a trailing edge of the double-edge pulse density modulated configuration data used to encode the first configuration data for the integrated audio amplification circuit, and
an opposite edge of the dual-edge pulse density modulated configuration data used to encode second configuration data for another integrated audio amplification circuit connectable to the output terminal for receipt of the digital audio stream.

2. The integrated audio amplification circuit according to claim 1, wherein the controller is configured to:
select the first state for a predetermined time period after receipt of a clock signal supplied through a clock input terminal of the integrated audio amplification circuit; and
automatically switch to the second state after expiry of the predetermined time period.

3. The integrated audio amplification circuit according to claim 1, wherein the controller is configured to:
select the first state for a predetermined time period in response to a power-on signal of the integrated audio amplification circuit; and
switch to the second state in response to receipt of a clock signal supplied through a clock input terminal of the integrated audio amplification circuit.

4. The integrated audio amplification circuit according to claim 1, wherein the power-on of the integrated audio amplification circuit is indicated by a power-on-reset signal.

5. The integrated audio amplification circuit according to claim 1, wherein the controller is configured for asynchronous reading of the first configuration data through the serial data receipt interface in the second state.

6. The integrated audio amplification circuit according to claim 1, wherein the controller is configured for synchronous reading of the first configuration data through the serial data receipt interface in the second state based on an incoming clock signal applied to a clock input terminal of the integrated audio amplification circuit.

7. The integrated audio amplification circuit according to claim 1, wherein the controller is configured for reading the first configuration data formatted in accordance with a predetermined serial data protocol; the serial data protocol comprising:
a pre-amble with a predetermined number of bits,
a register address of a configuration register of the programmable configuration setting of the signal processor,
a parameter value of the configuration register.

8. The integrated audio amplification circuit according to claim 1, wherein the serial data transmission interface is configured for generation of a dual-channel digital audio stream comprising a first data channel and a second data channel;
the controller being configured to encode the processed digital audio signal on the first or the second data channel in accordance with the logic state of the external configuration terminal during the first state.

9. The integrated audio amplification circuit according to claim 1, wherein the programmable configuration setting of the signal processor comprises:
a first power mode set by one or more configuration parameters of the first configuration data defining a first power consumption of the signal processor,
a second power mode set by the one or more configuration parameters defining a second power consumption of the signal processor; wherein the first power consumption is larger than the second power consumption.

10. The integrated audio amplification circuit according to claim 1, wherein the signal processor comprises:
- a sigma-delta analog-to-digital converter configured to supply the processed digital audio signal to the serial audio data interface.

11. The integrated audio amplification circuit according to claim 1, wherein the input impedance at the input terminal is larger than 10 GΩ, measured at 1 kHz.

12. The A semiconductor die or substrate comprising an audio amplification circuit according to claim 1.

13. A sound processing circuit assembly comprising:
- an audio amplification circuit according to claim 1;
- a digital signal processor comprising:
- a first general purpose input-output port operatively coupled to the configuration terminal of the audio amplification circuit for transmitting the serial data stream comprising the first configuration data thereto,
- a second general purpose input-output port operatively coupled to the output terminal of the audio amplification circuit for receipt and reading of the digital audio stream generated by the audio amplification circuit.

14. The sound processing assembly according to claim 13, comprising:
- one of a pull-up resistance and a pull-down resistance coupled from the configuration terminal to a predetermined electric potential to set a logic state of the configuration terminal during the first state; and
- the first general purpose input-output port of the digital signal processor comprising a tri-state output driver.

* * * * *